(12) United States Patent
Grewing et al.

(10) Patent No.: US 7,616,059 B2
(45) Date of Patent: Nov. 10, 2009

(54) TEMPERATURE COMPENSATION OF SMALL SIGNAL GAIN OF AN AMPLIFIER STAGE

(75) Inventors: Christian Grewing, Sollentuna (SE); Detlev Theil, Bromma (SE); Stefan Van Waasen, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/788,036

(22) Filed: Apr. 18, 2007

(65) Prior Publication Data

US 2008/0231363 A1    Sep. 25, 2008

(30) Foreign Application Priority Data

Apr. 19, 2006  (EP) .................................. 06008126

(51) Int. Cl.
*H03F 3/45*   (2006.01)
(52) U.S. Cl. ......................... 330/256; 330/283
(58) Field of Classification Search ................. 330/256, 330/283
See application file for complete search history.

(56) References Cited

U.S. PATENT DOCUMENTS

| | | | | |
|---|---|---|---|---|
| 5,578,965 | A | 11/1996 | Kimura | .................... 330/254 |
| 6,414,547 | B1 * | 7/2002 | Shkap | .................... 330/256 X |
| 6,583,667 | B1 | 6/2003 | Dasgupta et al. | ........ 330/256 X |
| 6,600,373 | B1 | 7/2003 | Bailey et al. | ................. 330/260 |
| 6,803,819 | B2 | 10/2004 | Kim | .......................... 330/254 |
| 2006/0055463 | A1 | 3/2006 | Gudem et al. | ............... 330/283 |

OTHER PUBLICATIONS

Veeravalli, A., et al. "Transconductance Amplifier Structures With Very Small Transconductances: A Comparative Design Approach." *IEEE Journal of Solid-State Circuits*. vol. 37. No. 6. Jun. 2002. 770-775. (6 Pages).
Korotkov, A., et al. "A 2.5-V, 0.35 μm CMOS transconductance-capacitor filter with enhanced linearity." The 2002 45th Midwest Symposium on Circuits and Systems. Tulsa, IEEE 2002. 141-144. (4 Pages).

* cited by examiner

*Primary Examiner*—Steven J Mottola
(74) *Attorney, Agent, or Firm*—Maginot, Moore & Beck

(57) ABSTRACT

The invention relates to an differential amplifier circuit comprising an amplifier stage comprising a first and a second transistor, the gates of which are connected to differential input terminals of the amplifier stage. The differential amplifier further comprises a temperature compensation circuit comprising a third and fourth transistor. The third transistor is connected to the source of the first transistor and the fourth transistor is connected to the source of the second transistor. Further, the temperature compensation circuit comprises a constant current source connected to the respective sources of the third and fourth transistors. Thereby the temperature compensation circuit is arranged to provide a feedback resistance in dependence on the operating temperature so as to compensate for variations of the resistance of the first and second transistors.

6 Claims, 1 Drawing Sheet

TEMPERATURE COMPENSATION OF SMALL SIGNAL GAIN OF AN AMPLIFIER STAGE

CROSS-REFERENCE TO RELATED APPLICATION

This application claims priority from European Patent Application No. 06008126.2, which was filed on Apr. 19, 2006, and is incorporated herein by reference in its entirety.

BACKGROUND OF THE INVENTION

1. Field of the Invention

The invention relates to the field of amplifiers and in particular to temperature compensation of an amplifier stage.

2. Description of Related Art

Metal oxide semiconductor field effect transistors (MOSFETs) as well as other kinds of transistors are temperature dependent, and the current through a MOS transistor decreases as the temperature increases. This implies that the power output of an integrated circuit comprising such transistors also decreases as the temperature increases. The gain of such integrated circuits therefore varies a great deal in dependence on the operating temperature; the gain is reduced as the temperature increases. This is naturally also true for CMOS (Complementary MOS) transistors comprising p-type and n-type MOSFETs.

For amplifier stages, such as for example output drivers, a constant gain is desired to ensure constant power output and high linearity of the amplifier stage.

To provide such constant gain, one solution is to optimize the gain and linearity for the worst-case scenario, i.e. the worst-case temperatures and allow performance penalty or regulation loop and trimming to ensure the system performance in the presence of gain losses. For example, adding a circuit comprising one or more resistors and diodes can compensate for the temperature dependence of an amplifier. The characteristics of these resistors and diodes are chosen so that the mentioned worst-case temperatures can be handled.

Another commonly used solution is to design a device comprising an amplifier to have a programmable current, wherein the supply current is programmable over a certain range. In such a solution, a certain predetermined current is pre-programmed for use at a certain temperature. However, a disadvantage of using a programmable current amplifier is that the manufacturing costs are increased due to the additional and complicated manufacturing steps required. Further, the accuracy of such solution is not always adequate, as the current can only be programmed in certain discrete steps.

From the above, it is clear that it would be desirable to provide an improved amplifier stage, which is less temperature sensitive. In particular, it would be desirable to provide an improved temperature compensating circuit for an amplifier stage.

SUMMARY OF THE INVENTION

It is an object of the invention to provide an amplifier stage in which the gain of the amplifier stage is maintained irrespective of the operating temperature, whereby the above-mentioned disadvantages of prior art solutions are overcome or at least alleviated. In particular, an object is to provide an amplifier stage delivering an essentially constant gain.

It is another object of the invention to provide an amplifier stage in which the current consumption is minimized.

In accordance with the invention a differential amplifier stage is provided, having two differential coupled transistors constituting an amplifier stage. The gates of these transistors are connected to differential input terminals of the amplifier stage. Further, a temperature compensation circuit is included having a third and fourth transistor, wherein the drain of the third transistor is connected to the source of the first transistor, and the drain of the fourth transistor is connected to the source of said second transistor. The temperature compensation circuit further has a constant current source connected to the respective sources of the third and fourth transistors. Thereby the temperature compensation circuit is arranged to provide a feedback resistance in dependence on the operating temperature so as to compensate for variations of the resistance of the amplifier transistors. By means of invention, the small signal gain of the amplifier stage is influenced by the two CMOS transistors included in the temperature compensation circuit. The CMOS transistors of the temperature compensation circuit will control the gain of the amplifier stage by means of a controlled feedback resistance. A temperature dependent voltage of the temperature compensation circuit will set the linearity of the gain so that the gain of the amplifier stage has minimum dependence on temperature. An improved amplifier stage having constant small signal gain is thereby provided. The gain of the amplifier stage is kept constant although the operating temperature varies.

Further characteristics of the invention and advantages thereof will be evident from the detailed description of a preferred embodiment of the present invention given hereinafter and the accompanying FIG. 1, which is only given by way of illustration, and thus are not limitative of the present invention.

DETAILED DESCRIPTION OF PREFERRED EMBODIMENTS

Figure 1:
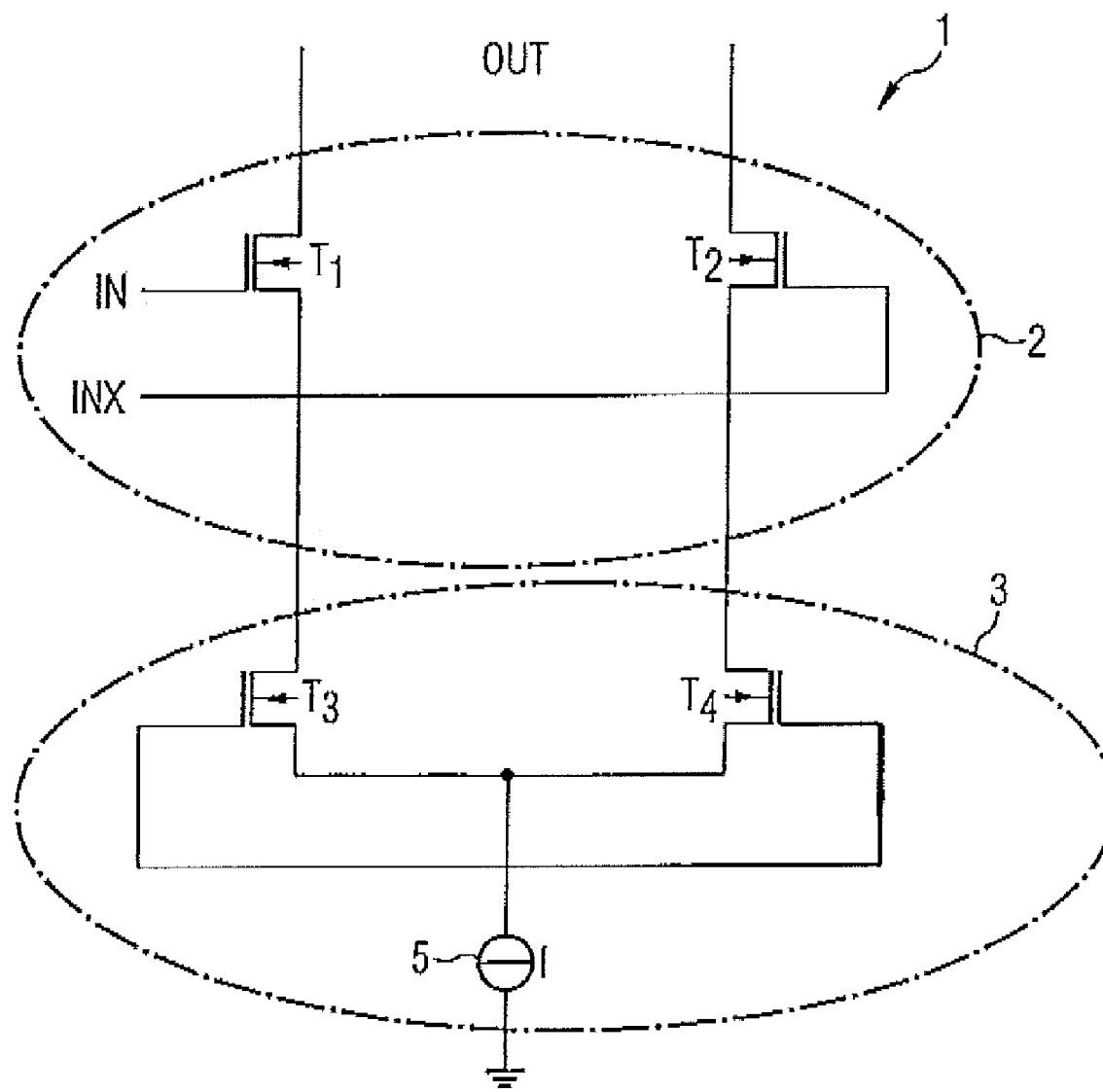
FIG. 1 illustrates an embodiment of the amplifier stage comprising a temperature compensation circuit in accordance with the invention.

An embodiment of an amplifier stage including a circuit for mitigating effects of changes in operating temperature is shown in FIG. 1. The amplifier circuit 1 comprises a differential amplifier stage, which is encircled by dashed lines and indicated by reference numeral 2. The amplifier circuit 1 further comprises a temperature compensation circuit, also encircled by dashed lines, and indicated by reference numeral 3. The differential amplifier stage 2 comprises, in a conventional manner, two transistors $T_1$ and $T_2$, the amplifier transistors. The gates of the respective transistor $T_1$ and $T_2$ are connected to input terminals IN and INX, and the drains of the transistors $T_1$ and $T_2$ are connected to an output of the circuit 1. A differential input voltage is fed to the transistors $T_1$ and $T_2$ by means of the differential input terminals IN and INX. The differential amplifier stage 2 amplifies a voltage difference between the gates of the transistors $T_1$ and $T_2$.

The input DC voltage is typically between 1 V and 2,5 V and a typical value of the input signal is 300 mV. However, it is realised that other DC input voltage values and input signal values than the mentioned can be applied as well. The input signal is typically a RF (Radio Frequency) signal.

In a conventional amplifier stage, the gain would vary in dependence on the operating temperature if no temperature compensating means were included. More specifically, the gain would be inversely proportional to the operating temperature and would thus decrease as the operating temperature increases. The voltage swing of the input signal due to a varying operating temperature is common to both transistors $T_1$ and $T_2$ of the amplifier stage 2.

In accordance with the invention, the gain is prevented from varying in an innovative and yet simple manner. A temperature compensation circuit 3 is implemented that provides a controlled feedback resistance. The temperature compensation circuit 3 is arranged to influence the small signal gain of an amplifier stage 2, as will be described in the following.

The temperature compensation circuit 3 comprises two CMOS transistors $T_3$ and $T_4$. The drains of these transistors $T_3$ and $T_4$ are connected to the sources of the transistors $T_2$ and $T_2$ of the amplifier stage 2. The sources of the transistors $T_3$ and $T_4$ are interconnected and coupled to a current source 5, providing a constant current. Further, the gates of the two CMOS transistors $T_3$ and $T_4$ are also interconnected. The current source 5 provides a constant current, for example 5 mA, although other current values are conceivable. A current that is proportional to the operating temperature is provided by this current source 5.

The temperature compensation circuit 3 can thus be seen as a temperature dependent voltage source, the output of which is made temperature dependent. The temperature compensation circuit 3 is thus another differential amplifier, providing a feedback resistance. The gain of this differential amplifier or temperature compensation circuit 3 is dependent on the operating temperature.

As the operating temperature of the circuit 1 increases, the resistance of the transistors $T_1$ and $T_2$ increases and the current thus decreases. This implies that the power gain of the amplifier stage would decrease. However, in accordance with the invention, the aim is to keep the gain at a constant level. Therefore, as the resistance of the transistors $T_1$ and $T_2$ in the amplifier stage 2 increases with increasing temperature, the resistance of the transistors $T_3$ and $T_4$ in the temperature compensation circuit 3 decrease. Conversely, as the resistance of the transistors $T_1$ and $T_2$ in the amplifier stage 2 decreases with decreasing temperature, the resistance of the transistors $T_3$ and $T_4$ in the temperature compensation circuit 3 increase.

The above temperature compensation circuit 3 can thus be seen as providing a temperature dependent voltage V(T) that is applied to the differential amplifier stage 2, and the transistors $T_3$ and $T_4$ compensate for differing currents applied to the transistors $T_1$ and $T_2$, due to varying resistance of the transistors. This varying resistance is accomplished by means of the temperature dependent current source 5, described above.

The stability of the amplifier stage against temperature changes is thus improved in a simple manner, namely by utilizing a temperature-controlled feedback. The circuit has a simple design, comprises only few components and therefore no complicated connection steps are required. Further, since the circuit in accordance with the invention has a simple layout, minimized manufacturing costs can be obtained.

The differential amplifier circuit 1 in accordance with the invention may be utilised for low voltage amplification, for example in a transmitter or other radio communication components. That is, the gain of an RF signal input to the amplifier stage 2 can be increased.

In the above description and drawing CMOS transistors are described and shown, respectively. However, in alternative embodiments other types of transistors could be used, such as for example field effect transistors or bipolar transistors.

In summary, two CMOS transistors influence the small signal gain of an amplifier stage. The CMOS transistors will control the gain of the amplifier stage by means of a controlled feedback resistance, or stated differently, the gain of the input signal is increased by means of a temperature dependent voltage of a temperature compensation circuit. The temperature dependent voltage will set the linearity of the gain so that the gain of the amplifier stage has minimum dependence on temperature. The gain of the amplifier stage is thus kept constant although the operating temperature varies.

In the preceding detailed description, the invention is described with reference to specific exemplary embodiments thereof. Various modifications and changes may be made thereto without departing from the scope of the invention as set forth in the claims. The specification and drawing are, accordingly, to be regarded in an illustrative rather than a restrictive sense.

What is claimed is:

1. A differential amplifier circuit comprising:
    an amplifier stage comprising a first and a second transistor, the gates of which are connected to differential input terminals of said amplifier stage, and
    a temperature compensation circuit comprising a third and a fourth transistor and a constant current source connected to the respective sources of said third and fourth transistors and providing a current that is dependent on an operational temperature,
    wherein the drain of said third transistor is connected to the source of said first transistor and the drain of said fourth transistor is connected to the source of said second transistor, and
    wherein the gate of the third transistor is connected only to the gate of the fourth transistor and the gate of the fourth transistor is connected only to the gate of the third transistor for providing a varying feedback resistance by means of the current source independent from the operating temperature thereby compensating for variations of the resistance of said first and second transistors.

2. The differential amplifier circuit as claimed in claim 1, wherein said transistors are CMOS transistors.

3. The differential amplifier circuit as claimed in claim 1, wherein said constant current source provides a current of 5 mA.

4. The differential amplifier circuit as claimed in claim 1, wherein a radio frequency signal is input to said differential input terminals.

5. The differential amplifier circuit as claimed in claim 1, wherein the circuit is utilized for low voltage amplification.

6. The differential amplifier circuit as claimed in claim 1, wherein said circuit is utilized as an output driver.

* * * * *